US012230608B2

(12) United States Patent
Jensen et al.

(10) Patent No.: US 12,230,608 B2
(45) Date of Patent: Feb. 18, 2025

(54) SEMICONDUCTOR ASSEMBLIES WITH SYSTEM AND METHODS FOR CONVEYING SIGNALS USING THROUGH MOLD VIAS

(71) Applicant: Micron Technology, Inc., Boise, ID (US)

(72) Inventors: Travis M. Jensen, Boise, ID (US); Raj K. Bansal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 704 days.

(21) Appl. No.: 17/478,284

(22) Filed: Sep. 17, 2021

(65) Prior Publication Data

US 2023/0055425 A1  Feb. 23, 2023

Related U.S. Application Data

(60) Provisional application No. 63/234,922, filed on Aug. 19, 2021.

(51) Int. Cl.
*H01L 25/065* (2023.01)
*H01L 21/56* (2006.01)
*H01L 23/00* (2006.01)
*H01L 25/00* (2006.01)

(52) U.S. Cl.
CPC ........ *H01L 25/0657* (2013.01); *H01L 21/565* (2013.01); *H01L 24/19* (2013.01); *H01L 24/20* (2013.01); *H01L 25/50* (2013.01); *H01L 2224/2101* (2013.01); *H01L 2225/06548* (2013.01)

(58) Field of Classification Search
CPC ... H01L 25/0657; H01L 21/565; H01L 24/19; H01L 24/20; H01L 25/50; H01L 2224/2101; H01L 2225/06548
See application file for complete search history.

(56) References Cited

U.S. PATENT DOCUMENTS

| | | | |
|---|---|---|---|
| 2019/0333899 A1* | 10/2019 | Eom | H01L 25/18 |
| 2020/0075490 A1* | 3/2020 | Sung | H01L 23/5385 |
| 2021/0175218 A1* | 6/2021 | Choi | H01L 23/3135 |
| 2021/0193622 A1* | 6/2021 | Choi | H01L 23/5384 |

* cited by examiner

*Primary Examiner* — Fernando L Toledo
*Assistant Examiner* — Neil R Prasad
(74) *Attorney, Agent, or Firm* — Perkins Coie LLP (57) ABSTRACT

A semiconductor device has first and second dies forming a die stack. Molding material encapsulates the die stack and forms an upper molded surface of the die stack. First conductive traces are coupled to the first die and extend from between the first and second die to corresponding first via locations in the molding material beyond a first side edge of the die stack. Second conductive traces coupled to an active surface of the second die opposite the first die extend to corresponding second via locations. Each first via location is vertically aligned with one of the second via locations. Through mold vias extend through the molding material between vertically aligned via locations to contact with corresponding conductive traces of the first and second dies, while the molding material that extends between the first conductive traces and the upper molded surface is free from any TMV.

12 Claims, 8 Drawing Sheets

SEMICONDUCTOR ASSEMBLIES WITH SYSTEM AND METHODS FOR CONVEYING SIGNALS USING THROUGH MOLD VIAS

CROSS-REFERENCE TO RELATED APPLICATION(S)

The present application claims priority to U.S. Provisional Patent Application No. 63/234,922, filed Aug. 19, 2021, the disclosure of which is incorporated herein by reference in its entirety.

TECHNICAL FIELD

The present technology is directed to semiconductor device packaging. More particularly, some embodiments of the present technology relate to techniques for conveying signals between dies in a die stack and a fan-out redistribution layer and/or substrate.

BACKGROUND

Semiconductor dies, including memory chips, microprocessor chips, logic chips and imager chips, are typically assembled by mounting a plurality of semiconductor dies, individually or in die stacks, on a substrate in a grid pattern. The mounted die stacks are then encased in a polymeric material (e.g., a resin) in a wafer-level molding process.

Market pressures continually drive semiconductor manufacturers to increase the functional capacity of each die package to meet operating parameters such as increased data rates. Vertically stacking semiconductor dies can increase the processing power of a semiconductor package, but may also increase the surface area covered by the package. The dies in such vertically-stacked packages can be electrically coupled to each other and/or to a substrate via electrical connectors, interconnects, or other conductive structures. However, the length of the data path in conventional semiconductor packages can limit the data rate. It is desirable to provide electrical connections that facilitate increased data rates.

BRIEF DESCRIPTION OF THE DRAWINGS

Many aspects of the present technology can be better understood with reference to the following drawings. The components in the drawings are not necessarily to scale. Instead, emphasis is placed on illustrating the principles of the present technology.

DETAILED DESCRIPTION

Specific details of several embodiments for conveying bidirectional signals, communication, and/or power in a semiconductor device are described below. In some embodiments, for example, a semiconductor assembly, package, and/or device includes two or more dies in a die stack. At least one through mold via (TMV) is provided along a side edge of the die stack and interconnects conductive traces, such as traces of a fan-out redistribution layer, of two or more dies in the die stack. The traces extend beyond side edges of their associated die to intersect the TMV. A technical advantage is realized as bidirectional high speed signals can be conveyed through the fan-out distribution layers and the TMV(s) to a redistribution structure, such as a fan-out package and/or other substrate. The dies in the die stack can be vertically aligned with each other, eliminating the shingling or offset of dies that is required for wire bonding between the dies. This minimizes the footprint of the die stack (e.g., the lateral space needed) and can allow higher die stacks to be formed with stability. An additional technical advantage is realized as the conductive traces can be routed to any side of the die to be interconnected with a corresponding TMV. Therefore, shorter distances can be selected to improve signal transmission rates. As TMVs can be provided proximate more than one of the die edges, such as up to all four die edges, more effective power distribution is realized as power is supplied to each die in the die stack from the redistribution structure, substrate, and/or fan-out package formed on the bottom of the die stack.

Another expected advantage of the embodiments shown is the ability to eliminate through silicon vias, which are formed in the dies themselves and are expensive to create. Through silicon vias require space to be dedicated to them on the die and result in reduced yields during production.

A further advantage of some embodiments is that the encapsulant formed along the top of the semiconductor device does not need to be as thick compared to packages that require the encapsulant to cover the wire bonds that protrude from the top surface of the upper die. Accordingly, there is a smaller upper die to mold clearance requirement, and the overall package can be thinner.

Furthermore, by using instant back side wafer processing, an in-line redistribution layer that was previously used to distribute power within the die can be eliminated. Therefore, the elimination of a fabrication layer as well as the elimination of wire bonds that interconnect one die to another improves the assembly/manufacturing process of the semiconductor device.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1-5. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below", "top", and "bottom" can refer to relative directions or positions of features in the semiconductor devices in view of the orientation shown in the Figures. For example, "upper", "uppermost", or "top"

can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
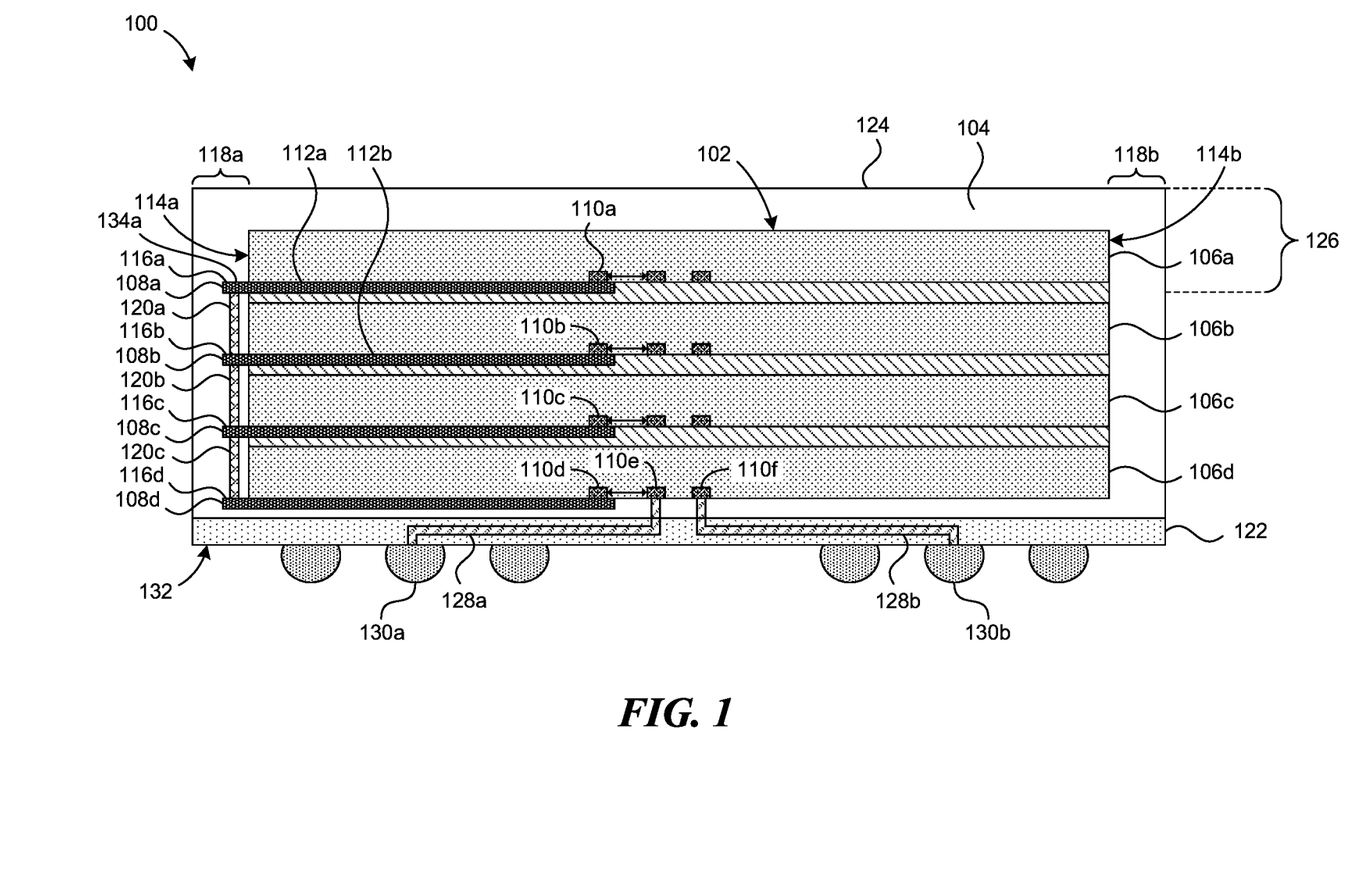
FIG. 1 is a cross-sectional view of a semiconductor device including dies in a die stack that are electrically connected to through mold vias by conductive traces of fan-out redistribution layers in accordance with the present technology.

FIG. 1 illustrates an overview of the present technology, while FIGS. 2-5 illustrate further details of the present technology. Like reference numbers relate to similar components and features in FIGS. 1-4. The present technology addresses the technical problem of signal crowding, which can cause crosstalk, as well as the length of the data path. A reduced or shorter data path can facilitate higher speed signals.

FIG. 1 is a cross-sectional view of a semiconductor device 100 that includes a die stack 102 encapsulated in a protective molding material 104 in accordance with embodiments of the present technology. In the example shown, the die stack 102 includes four dies 106 (identified individually as 106a, 106b, 106c, 106d.) In other embodiments, the die stack 102 can include two dies 106, three dies 106, or more than four dies 106. A fan-out redistribution layer (FO RDL) 108 (identified individually as 108a, 108b, 108c, 108d) is formed on at least some of the dies. The FO RDL 108 includes one or more conductive traces that are operably coupled to one or more interconnects such as bond pads 110 (identified individually as 110a, 110b, 110c, 110d) on an active surface 112 (not all are individually indicated) of the die 106. The FO RDL 108 extends from between two dies 106 and beyond one or more side edges 114a, 114b of the associated die 106 and the die stack 102 to vertically aligned via locations 116 (identified individually as 116a, 116b, 116c, 116d) in edge regions 118a, 118b of the molding material 104. Although only two side edges 114 of the die stack 102 and two edge regions 118 are indicated, the die stack 102 has four side edges 114 and four edge regions 118.

The conductive traces of the FO RDL 108 are electrically connected to end surfaces of through mold vias (TMVs) 120 (identified individually as 120a, 120b, 120c) formed in corresponding via locations 116 in the lateral or edge regions 118 of the molding material 104 proximate the side edges 114 of the die stack 102. The TMVs 120 can be parallel or substantially parallel to, positioned alongside, or aligned with the side edge 114 (e.g., a vertical side) of the die stack 102.

Some of the electrical signals, such as the high speed signals, are conveyed through the conductive traces of the FO RDLs 108 through the TMVs 120 to the lowermost die 106d that functions as a primary or master die in the die stack 102. For example, in the embodiment shown, the lowermost die 106d can be the master die while the dies 106a, 106b, 106c can function as slave dies. The dies 106 are connected in parallel, and the TMVs 120 convey bidirectional signals in parallel. The primary or lowermost die 106d has electrical connections, such as bond pads 110e, 110f, that are connected though conductive traces of FO RDL 128a, 128b to a redistribution structure 122 connected to the lowermost die 106d. The redistribution structure 122 can include e.g., one or more redistribution layers (RDLs), one or more passivation layer, a printed circuit board (PCB), an interposer, etc. Thus, in some embodiments, all or most of the electrical signals of the dies 106 in the die stack 102 are conveyed through the lowermost die 106d and can connect to solder balls 130a, 130b or other electrical interconnects formed and/or attached to outer surface 132 of the redistribution structure 122.

The TMVs 120 are formed singly and/or iteratively as dies 106 are added to the die stack 102 (discussed below in at least FIGS. 2F, 2H, and 4). The molding material 104 extends in a continuous area 126 free from TMVs 120 between an upper surface 134a of the FO RDL 108a of the uppermost die 106a of the die stack 102 and an upper molded surface 124 of the device 100. In some cases, if the TMV 120 extends beyond the FO RDL 108, the continuous area 126 can be free from TMVs 120 between an upper surface of the TMV 120 and the upper molded surface 124. In some embodiments the continuous area 126 can also be free from FO RDLs 108. Although only one continuous area 126 is indicated in FIG. 1, each of the edge regions 118 that have one or more TMV 120 can have a continuous area 126 that extends from the upper-most TMV 120 and/or FO RDL 108 to the upper molded surface 124.

At least one expected advantage of the embodiment shown in FIG. 1 is a reduction in the length of the routing distance when conveying high speed signals, because the signals can be routed to any side edge 114. This improves the ability of the device 100 to support higher speed signals. Also, as the power can be supplied to all dies 106 from the substrate or redistribution structure 122, a more effective power delivery network is realized.

Figure 2A:
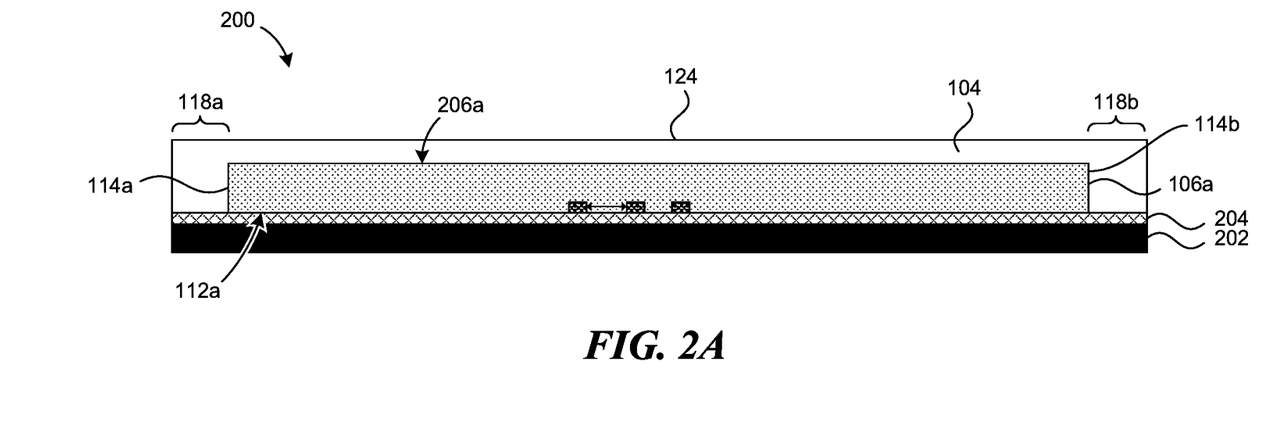
FIGS. 2A-2H show cross-sectional views of the assembly of the die stack shown in FIG. 1 in accordance with the present technology.

FIGS. 2A-2H show the dies 106 and the TMVs 120 of the device 100 of FIG. 1 during the assembly process. FIG. 2A is a cross-sectional view 200 of the die 106a that is mounted to a carrier 202 (e.g., carrier wafer) in accordance with embodiments of the present technology. A temporary adhesive 204 can be used to attach the active surface 112a of the die 106a to the carrier 202. The molding material 104 is formed over a back surface 206a of the die 106a and four side edges 114 of the die 106a (side edges 114a, 114b are indicated). The molding material 104 forms the upper molded surface 124 and extends beyond and over the side edges 114 of the die 106a to form the side edge regions 118a, 118b. In the example of FIGS. 2A-2H, the die 106a is the uppermost die 106 in the die stack 102, such as the die stack 102 shown in FIG. 1.

Figure 2B:
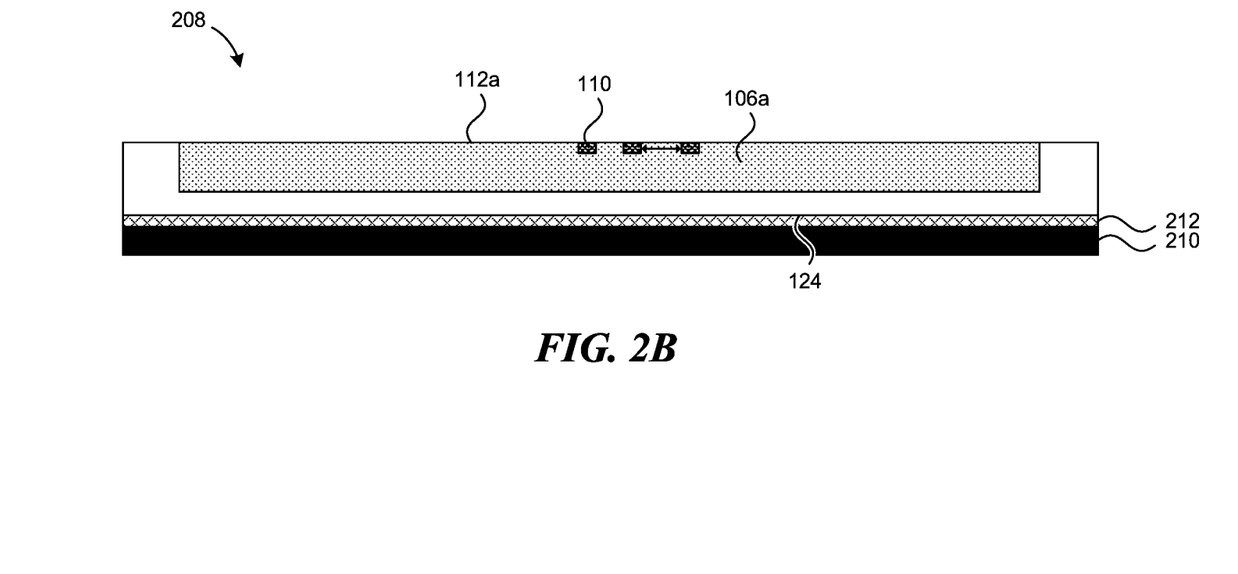

After the molding material 104 has been applied, the die 106a can be removed from the carrier 202 and flipped over as shown in cross-sectional view 208 of FIG. 2B, where the upper molded surface 124 is attached to a carrier 210, such as with a temporary adhesive 212. In some cases the active surface 112a of the die 106a can be processed and/or cleaned to remove adhesive, molding material, etc., with processes such as grinding, washing, etc. In some embodiments, the active surface 112a may be processed to expose bond pads 110 or other electrical contacts.

Figure 2C:
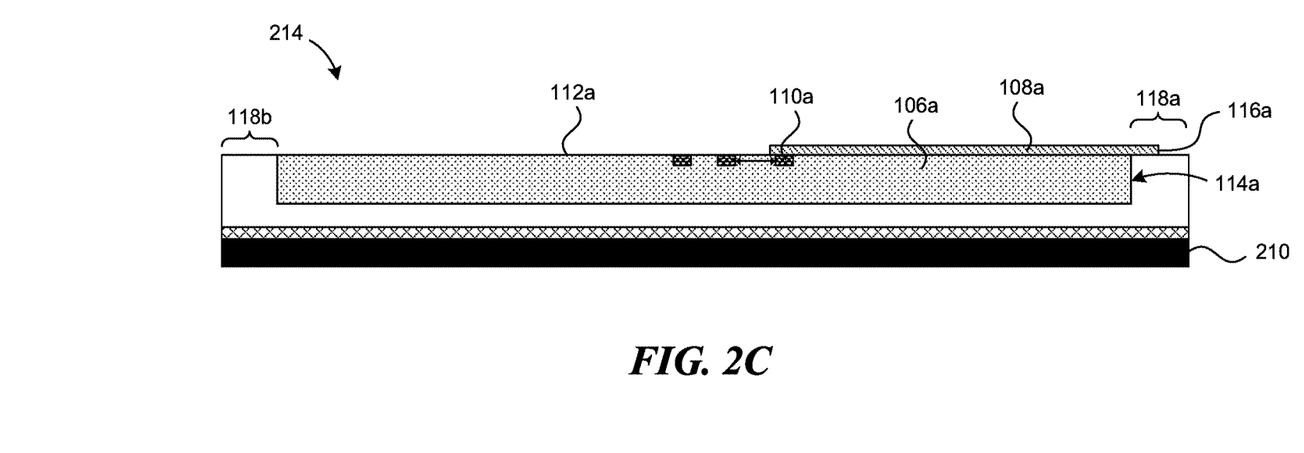

As shown in cross-sectional view 214 of FIG. 2C, conductive traces of the FO RDL 108a are formed on the active surface 112a of the die 106a. Known RDL and/or iRDL (inline redistribution layer) methods can be used to form the FO RDL 108. In other cases, a photoresist layer can be applied to the active surface 112, and patterning, electroplating, removing photoresist, etc., can be used to form the conductive traces. The conductive traces can be formed of copper, aluminum, gold, or other materials. The conductive traces of the FO RDL 108a are operably coupled to the bond pad(s) 110a (one is shown) on the active surface 112a of the die 106a and extend beyond the side edge 114a to the via location 116a inside the edge region 118a of the molding material 104. In some cases, polyimide with passivation openings to the bond pads 110 or other contacts can connect to the FO RDL 108. In some embodiments, there can be one conductive trace and one via location 116, while in other embodiments, there are at least two conductive traces and an equivalent number of via locations 116. Although not shown, other conductive trace(s) can be connected to bond pad(s) 110 and extend to other via location(s) 116 in any of the three other edge regions 118.

Figure 2D:
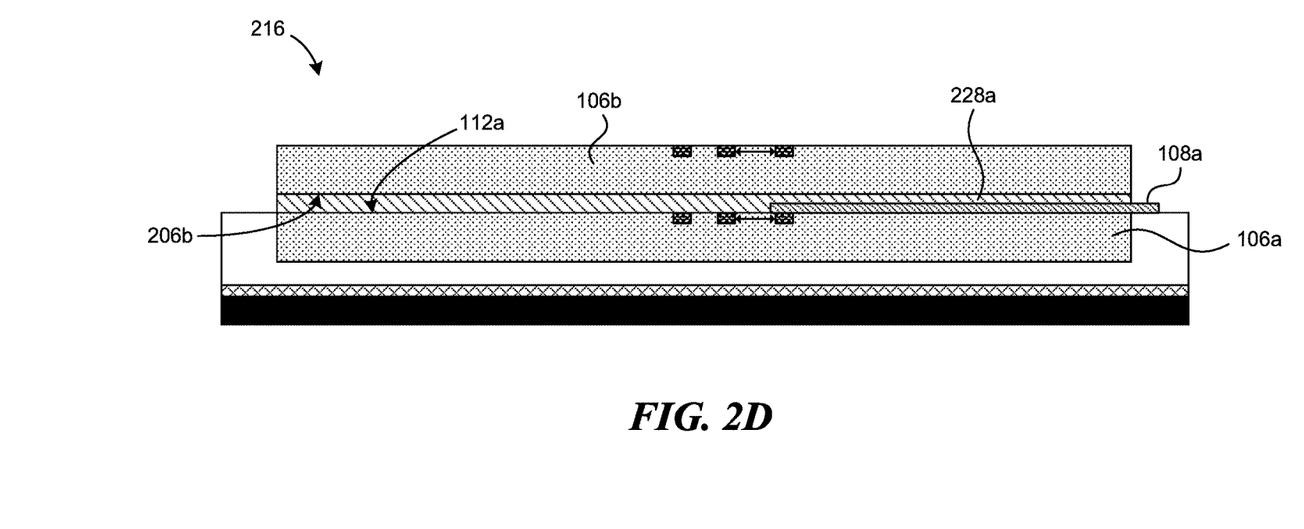

FIG. 2D shows a cross-sectional view 216 of the die 106b that has been adhered to the die 106a in accordance with embodiments of the present technology. An adhesive layer 228a, such as die attach film, film over wire, or other materials known in the art can be used to adhere the back surface 206b of the die 106b over the active surface 112a of the die 106a, while also separating the FO RDL 108a from the die 106b.

Figure 2E:
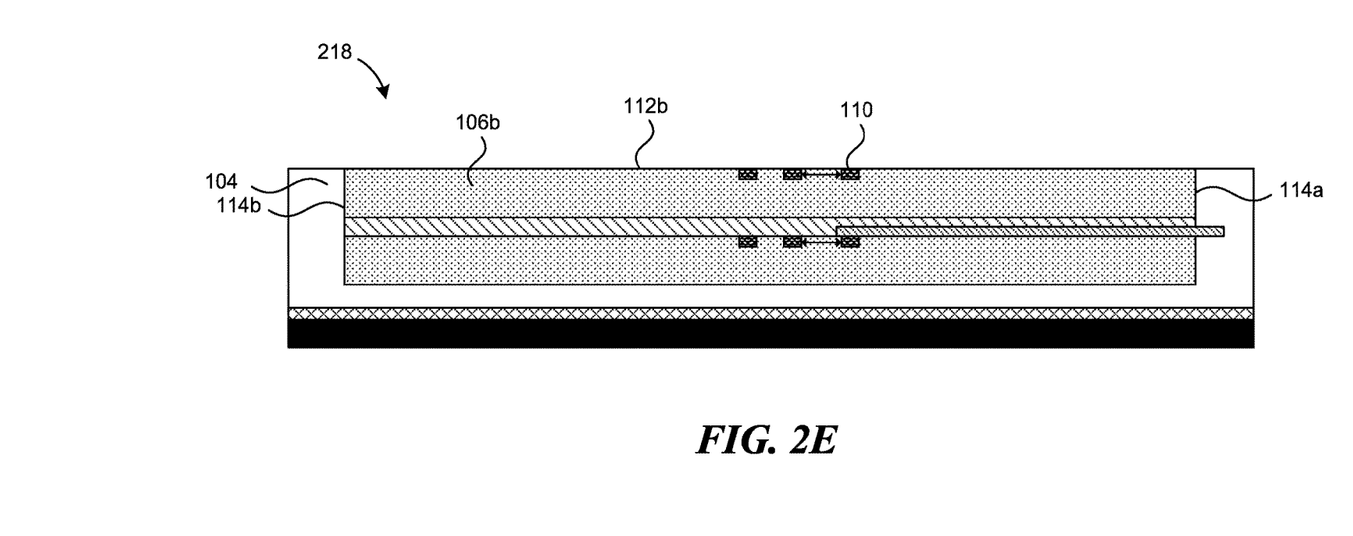

At least the side edges 114 of the die 106b are overmolded with the molding material 104 as shown in cross-sectional view 218 of FIG. 2E in accordance with embodiments of the present technology. In some embodiments, the exposed active surface 112b of the die 106b, or portions thereof, can be masked and then washed after the overmolding process. For example, a photoresist material can be placed over/on the bond pads 110 and hardened, then subsequently removed to expose the bond pads 110. In other embodiments, the molding material 104 can be ground, etched, or otherwise processed to expose the bond pads 110 on the active surface 112b. In some cases, the molding material 104 may be retained on portions of the active surface 112b as a barrier between the die 106b and a subsequently added die 106.

Figure 2F:
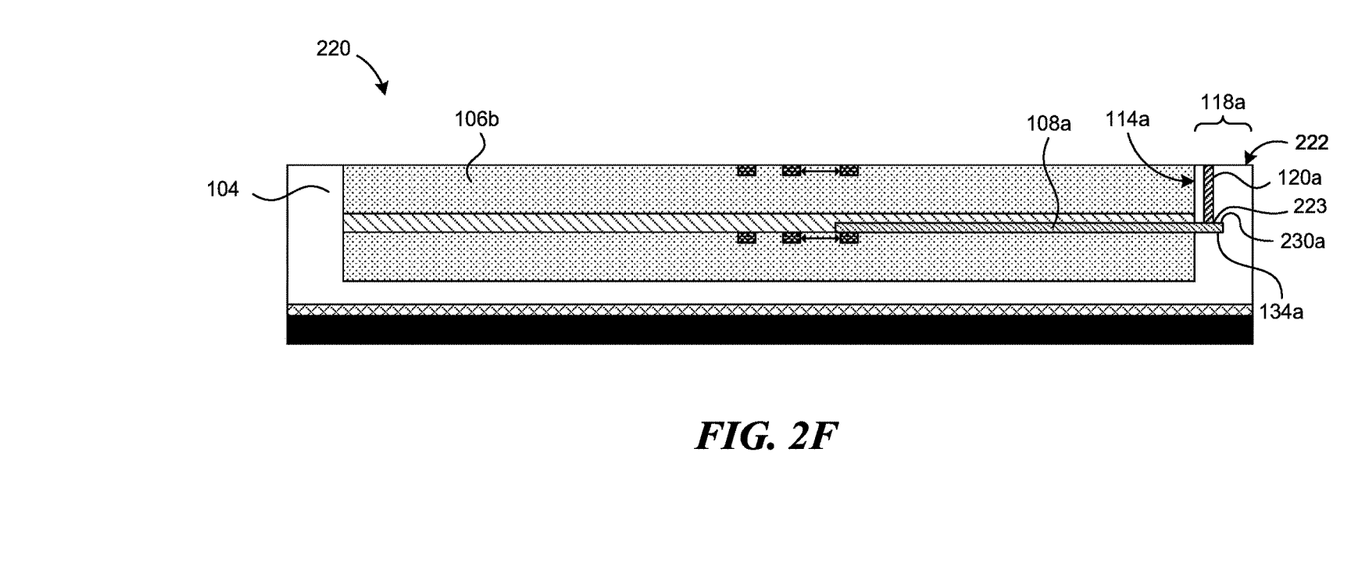

The TMV 120a is formed in the side region 118a of the molding material 104 proximate the side edge 114a of the die 106b as shown in cross-sectional view 220 of FIG. 2F in accordance with embodiments of the present technology. The TMV 120a can be formed using laser drilling, mechanical drilling, etching (e.g., patterning and wet or dry etch), etc. The TMV 120a extends from a surface 222 of the molding material 104 to the FO RDL 108a. The TMV 120a can extend to contact a first surface (e.g., bottom surface 230a) of the FO RDL 108a as shown with a first end surface 223. In other embodiments the first end surface 223 of the TMV 120a can extend into or penetrate the FO RDL 108a. In still further embodiments, the first end surface 223 of the TMV 120a can extend to or beyond the upper surface 134a of the FO RDL 108a. (Note that the assembly shown in FIG. 2F is inverted in comparison with the device 100 in FIG. 1.) As shown, the FO RDL 108a can be planar with the active surface 112a of the die 106a and extend beyond a point of intersection with the TMV 120a. In other embodiments, the FO RDL 108a can extend to just intersect with the TMV 120a. Conductive material, such as silver or copper or other conductive material or paste, can be used to plate or fill the TMV 120a, forming the conductive first end surface 223.

Figure 2G:
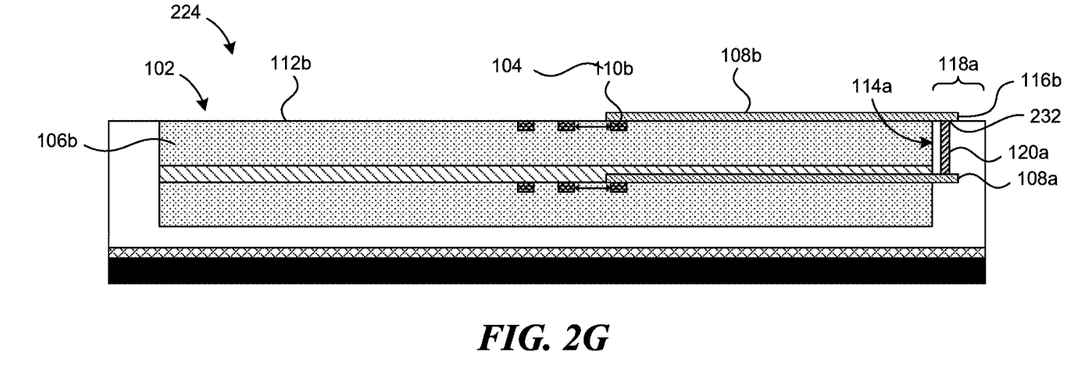

Similar to FIG. 2C, in cross-sectional view 224 of FIG. 2G, conductive traces of the FO RDL 108b are formed on the active surface 112b of the die 106b which is opposite the die 106a. The FO RDL 108b is operably coupled to at least the bond pad 110b on the die 106b and extends beyond the side edge 114a to the via location 116b inside the edge region 118a of the molding material 104. The via location 116b corresponds with and/or is in vertical alignment with the via location 116a. In some cases, the FO RDL 108b extends beyond the TMV 120a. The FO RDL 108b is electrically interconnected with an exposed conductive second end surface 232 of the TMV 120a. Therefore, the FO RDL 108a of the die 106a and the FO RDL 108b of the die 106b are electrically connected to each other through the TMV 120a, and thus the TMV 120a is connected to interconnects (e.g., bond pads 110, etc.) on the dies 106a, 106b.

As discussed previously, in some embodiments, the die stack 102 can include only two dies 106 as shown in FIG. 2G. In this case, the most recently added die, die 106b, would operate as the master die and would be connected to a substrate and/or redistribution structure 122 as discussed below in FIG. 2H.

Figure 2H:
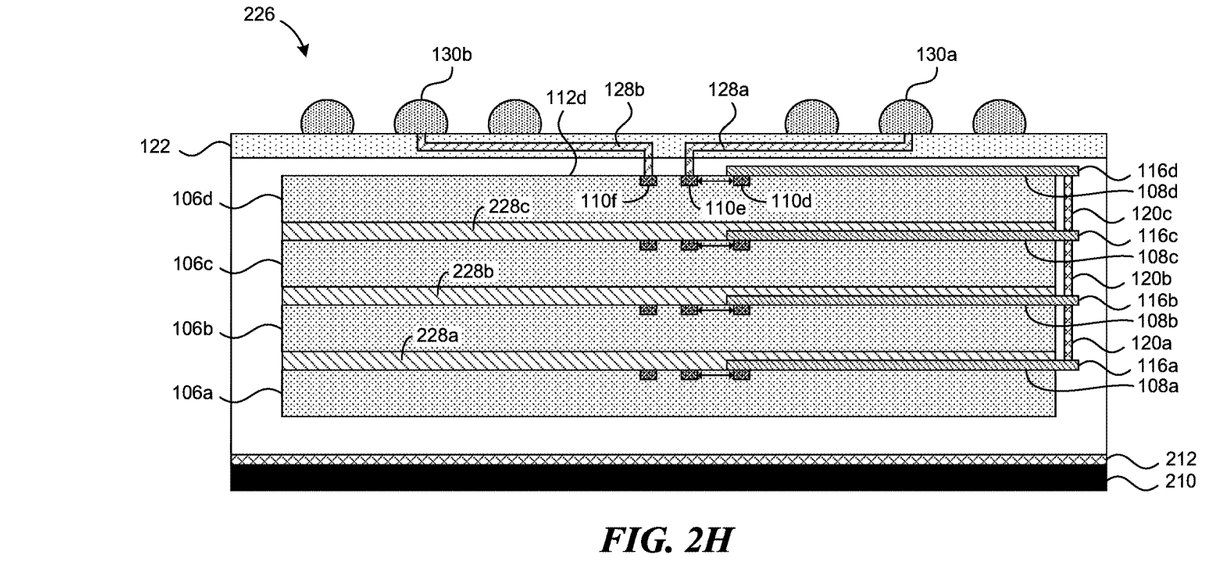

In other embodiments, one or more additional die 106 can be added as shown in cross-sectional view 226 of FIG. 2H in accordance with embodiments of the present technology. In the example shown, the die 106c is added to the die stack 102 (as discussed in FIGS. 2D-2G), including an adhesive layer 228b, overmolding, forming the TMV 120b, and forming the FO RDL 108c. An additional die 106, such as the die 106d, can be added in the same manner, including an adhesive layer 228c, overmolding, forming the TMV 120c, and forming the FO RDL 108d. The TMVs 120a, 120b, and 120c are vertically aligned with each other. In some embodiments there is an allowable tolerance such that one TMV 120 may be offset by the allowable tolerance while still being electrically connected to one or more other TMV located in the same edge region 118.

FIG. 2H also shows the redistribution structure 122 that has been formed, adhered to, and/or build on the active surface 112d of the die 106d (e.g., primary die). The redistribution structure 122 can include the FO RDL 128a, 128b (as shown in FIG. 1) with one or more passivation layers (e.g., RDL 128 can be formed between passivation layers with portions of the RDL 128 extending through the passivation layers, and in some embodiments is built in situ on the die 106d using the same FO RDL formation technique. In the embodiment shown, the die 106d is the primary die 106 that conveys/routes signals between the dies 106a-106d and the redistribution structure 122 or other substrate. Electrical traces of the FO RDL 128a, 128b are connected to the bond pads 110 or other contacts on the active surface 112d of the die 106d and extend into the redistribution structure 122. As shown, electrical traces of the FO RDL 128a, 128b extend through the redistribution structure 122 and connect with the solder balls 130 or other electrical contacts formed or mounted on the redistribution structure 122.

Figure 3:
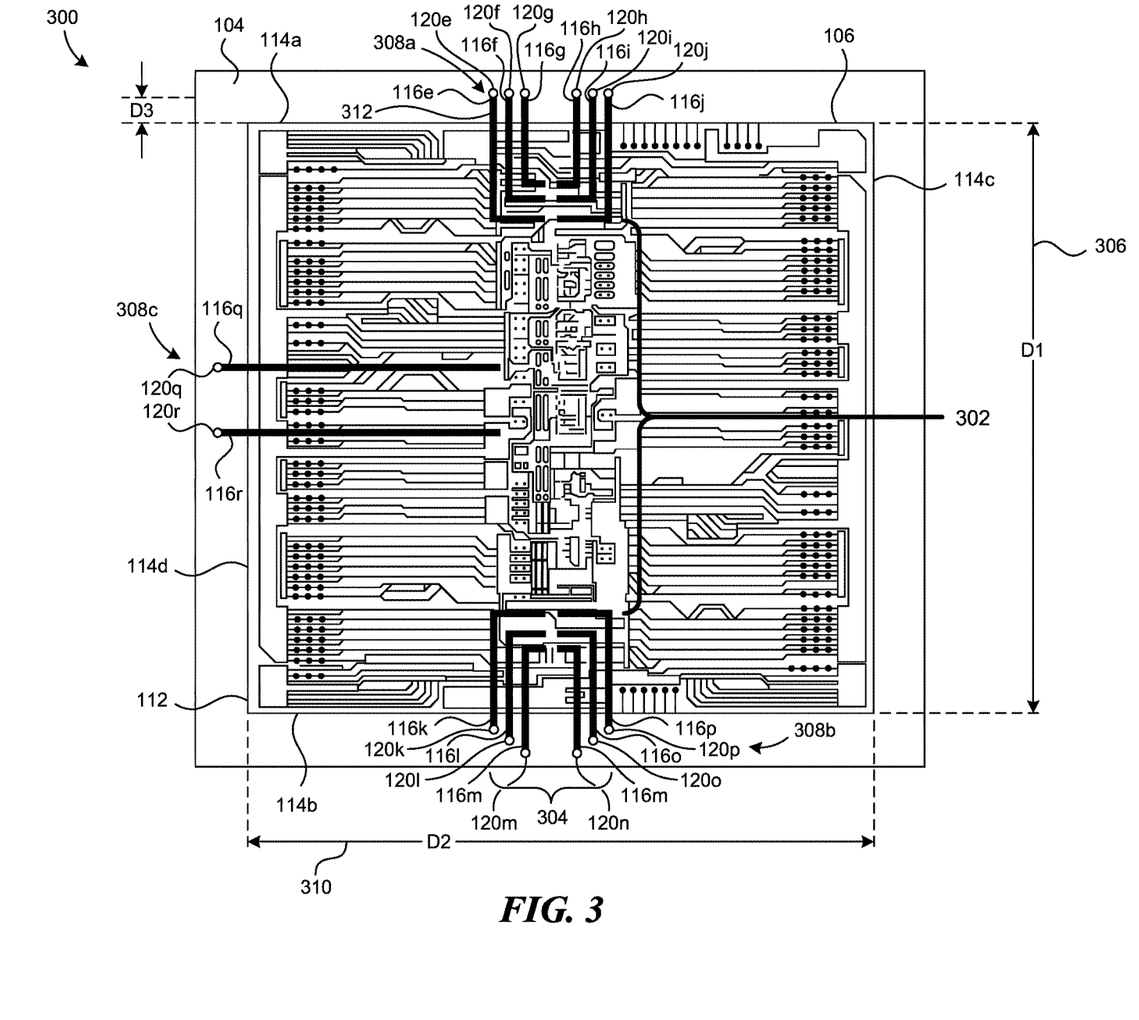
FIG. 3 shows a plan view of a die having fan-out redistribution layer traces that extend to locations in edge regions beyond the die formed in accordance with the present technology.

FIG. 3 shows a plan view 300 of an active surface of a die 106 that can be included in a die stack 102 (such as the die stack 102 of FIG. 1) formed in accordance with the present technology. In some embodiments as shown, a dRAM die 106 has a set of contacts 302 extending along a central region 304, such as to extend along one dimension D1 306 of the die 106. Sets of conductive traces 308a, 308b, 308c of the FO RDL extend planar to the active surface 112 of the die 106 from the central region 304 of the die 106 to via locations 116 in the molding material 104 beyond the side edges 114 of the die 106, and can be routed along the different dimensions 306, 310. For example, each of the conductive traces (e.g., one conductive trace 312 is indicated) in the set of conductive traces 308a extends to a corresponding via location 116e-116j proximate the side edge 114a of the die 106 that interfaces with the TMV 120e-120j as previously discussed. Similarly, each of the conductive traces 312 in the set of conductive traces 308b extends planar to the active surface 112 of the die 106 from the central region 304 of the die 106 to a corresponding via location 116k-116p in the molding material 104 beyond the side edge 114b of the die 106 to electrically and/or mechanically interface with one of the TMVs 120k-120p. Also, each of the conductive traces 312 in the set of conductive traces 308c extends planar to the active surface 112 of the die 106 from the central region 304 of the die 106 to a corresponding via location 116q, 116r in the molding material 104 beyond the side edge 114d of the die 106 to electrically and/or mechanically interface with one of the TMVs 120q, 120r.

An advantage of using the conductive traces 308 of the FO RDL 108 is that the position of the conductive traces 308 can minimize the length of the data path, improving the speed with which high speed signals can be transmitted. Another advantage is that multiple conductive traces 308 can be used to transmit high speed signals to minimize signal crowding. Therefore, in some embodiments, routing for high speed signals can be selected to direct the high speed signal along the shortest trace length to the closest side edge 114 of the die 106, providing flexibility and improving data rates. High speed signals can, for example, have data rates of 6400 Mbps or higher, and may be greater than 8400 Mbps, although it should be understood that a high speed signal can be defined to have a different data rate and may be defined relative to other signals conveyed by the FO RDL 108. In the example shown in FIG. 3, relatively higher speed signals may be routed through the set of conductive traces 308a, 308b along dimension 306 as the trace length between the contacts 302 is shorter to the side edges 114a, 114b compared to the distance to the side edges 114c, 114d. Relatively slower speed signals can be routed through the set of conductive traces 308c to the side edge 114d or a set of conductive traces (not shown) the side edge 114c.

In some embodiments, the via locations 116 (e.g., via locations 116e-116j) and/or the associated TMVs 120e-120j can be vertically aligned with respect to each other such that each TMV 120 is approximately a distance D3 from the side edge 114a. In other cases, one or more of the via locations 116 (e.g., via locations 116k-116p) and the associated TMVs 120k-120p can be located varying distances D (not individually indicated) from the side edge 114b.

As discussed previously, the TMVs 120 can be joined to extend from a position approximately planar with the active surface 112a of the base die 106a to a position approximately planar with the active surface 112 of the uppermost die 106 in the die stack 102 (e.g., active surface 112d of die 106d as shown in FIG. 1). Some dies 106 may not have a conductive trace that electrically interconnects with each available TMV 120. In other embodiments, one or more TMVs 120 can extend from a position approximately planar with the active surface 112a of the base die 106a to a position approximately planar with the active surface 112 of one of the dies 106 that is within the die stack 102 but not the uppermost die 106 in the die stack 102 (e.g., die 106b, 106c).

Figure 4:
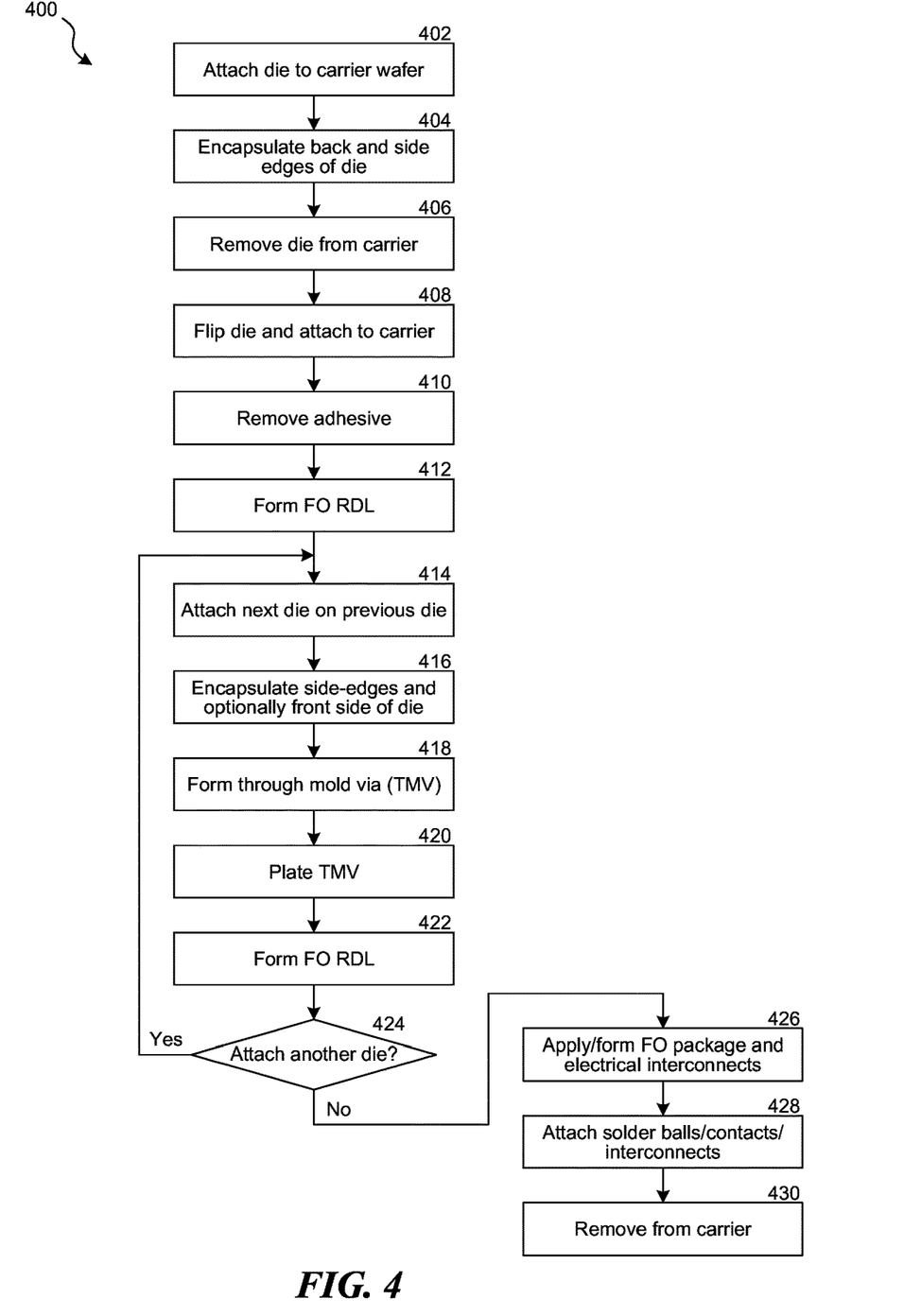
FIG. 4 is a flow chart of a method for assembling the die stack shown and discussed in FIGS. 1-2 in accordance with the present technology.

FIG. 4 is a flow chart of a method 400 for assembling the die stack 102 with at least one TMV 120 as shown and discussed in FIGS. 1-3 in accordance with the present technology. FIG. 4 will be discussed with reference to the FIGS. 2A-2H. The method 400 includes removably attaching the first die 106a with the adhesive 204 to the carrier 202 (block 402). There may be many dies 106 attached to the carrier 202, such as in a grid pattern. The first die 106a will be the uppermost die 106 in the die stack 102 and can, in some embodiments, function as the primary die of the die stack 102.

The molding material 104 is molded over the in-active side or back surface 206 and side edges 114 of the first die 106a to encapsulate the back surface 206 and side edges 114 (block 404). The first die 106a is then removed from the carrier 202 (block 406). In some cases the carrier 202 can be reused. The first die 106a is flipped or turned over and the upper molded surface 124 of the molded side of the first die 106a (e.g., the surface proximate the back surface 206a) is removably attached to the carrier 210 (block 408), such as with the temporary adhesive 212. The adhesive 204 and/or other residual materials on the active surface 112a of the first die 106a are removed (block 410). The conductive traces of the FO RDL 108a are formed on the active surface 112a of the first die 106a (block 412). In some embodiments, the FO RDL 108a is formed over a layer, such as a passivation layer, formed on all or portions of the active surface 112a. The conductive traces of the FO RDL 108a extend laterally to the edge region(s) 118 beyond the side edge(s) 114 of the first die 106a to first via locations 116 in the molding material 104. As discussed previously, one or more traces 308 may extend to an equal number of via locations 116.

The back surface 206 of the next die, such as the second die 106b, can be attached to the first die 106a (block 414). The adhesive layer 228 and/or a non-conductive film, such as die attach film or film over wire, or other known methods of connecting dies 106, can be used. The molding material 104 is molded over the side edges 114 of the second die 106b and forms the edge regions 118 (block 416). Optionally, the active surface 112b of the second die 106b can be encapsulated. Molding material 104 and/or other substances such as masking materials can be removed from at least the bond pads 110 of the active surface 112b. One or more TMV 120 is formed through the molding material 104 in one or more of the edge regions 118 (block 418). The TMV 120 extends from an upper surface 222 of the molding material 104 to the via location 116 associated with a conductive trace of the FO RDL 108a on the previous die (e.g., first die 106a). The TMV(s) 120 are plated or filled (block 420). The FO RDL 108b is formed on the active surface 112b of the most recently added die 106 (e.g., second die 106b) (block 422). If another die 106 is to be added to the die stack 102 (block 424), flow returns to block 414.

If no other dies 106 are to be added to the die stack 102 at block 424, the redistribution structure 122 is applied to the active surface 112 of the most-recently added die 106 (block 426). The redistribution structure 122 includes electrical contacts or traces, such as the FO RDL 128a, 128b shown in FIG. 2H that interconnect with contacts (e.g., bond pads 110e, 110f) on the active surface 112 of the die 106 and extend into and/or through the redistribution structure 122 to electrical interconnects, such as solder balls 130, that are formed and/or attached to the outer surface 132 of the redistribution structure 122 (block 428). The semiconductor device 100 can then be removed from the carrier 210 (block 430), and any residual adhesive 212 removed from the upper-most die 106 in the die stack 102.

In some embodiments, a plurality of semiconductor devices 100 can be fabricated at the same time, such as 200 or more devices 100 placed in a grid formation. The devices 100 can be singulated after being removed from the carrier 210, such as by using a saw blade, laser, or other singulation technique. In this case the carrier 210 may be reused. In other cases, the devices 100 can be singulated before being removed from the carrier 210.

Figure 5:
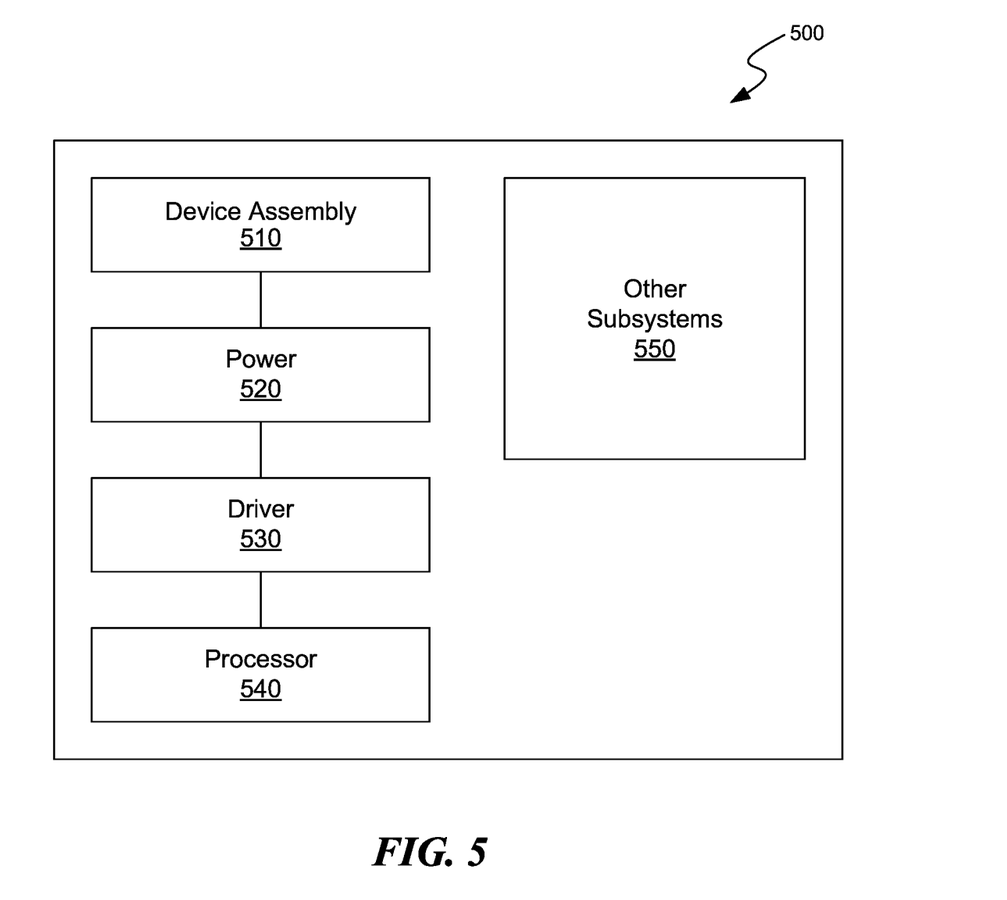
FIG. 5 is a schematic view showing a system that includes a semiconductor device and/or assembly configured in accordance with the present technology.

Any one of the semiconductor devices, assemblies, and/or packages described above with reference to FIGS. 1 through 4 can be incorporated into any of a myriad of larger and/or more complex systems, a representative example of which is system 500 shown schematically in FIG. 5. The system 500 can include a semiconductor device assembly 510, a power source 520, a driver 530, a processor 540, and/or other subsystems or components 550. The semiconductor device assembly 510 can include features generally similar to those of the semiconductor devices and assemblies described above. The resulting system 500 can perform any of a wide variety of functions such as memory storage, data processing, and/or other suitable functions. Accordingly, representative systems 500 can include, without limitation, handheld devices (e.g., mobile phones, tablets, digital readers, and digital audio players), computers, vehicle and other machines and appliances. Components of the system 500 may be housed in a single unit or distributed over multiple, interconnected units (e.g., through a communications network). The components of the system 500 can also include remote devices and any of a wide variety of computer readable media.

This disclosure is not intended to be exhaustive or to limit the present technology to the precise forms disclosed herein. Although specific embodiments are disclosed herein for illustrative purposes, various equivalent modifications are possible without deviating from the present technology, as those of ordinary skill in the relevant art will recognize. In some cases, well-known structures and functions have not been shown or described in detail to avoid unnecessarily obscuring the description of the embodiments of the present technology. Although steps of methods may be presented herein in a particular order, alternative embodiments may perform the steps in a different order. Similarly, certain aspects of the present technology disclosed in the context of particular embodiments can be combined or eliminated in other embodiments. Furthermore, while advantages associated with certain embodiments of the present technology may have been disclosed in the context of those embodiments, other embodiments can also exhibit such advantages, and not all embodiments need necessarily exhibit such advantages or other advantages disclosed herein to fall within the scope of the technology. Accordingly, the disclosure and associated technology can encompass other embodiments not expressly shown or described herein.

Throughout this disclosure, the singular terms "a," "an," and "the" include plural referents unless the context clearly indicates otherwise. Similarly, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the term "comprising" is used throughout to mean including at least the recited feature(s) such that any greater number of the same feature and/or additional types of other features are not precluded. Reference herein to "one embodiment," "some embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment. Furthermore, various particular features, structures, operations, or characteristics may be combined in any suitable manner in one or more embodiments.

From the foregoing, it will be appreciated that specific embodiments of the present technology have been described herein for purposes of illustration, but that various modifications may be made without deviating from the scope of the invention. The present technology is not limited except as by the appended claims.

We claim:

1. A semiconductor device comprising:
   first and second dies forming a die stack;
   a molding material encapsulating the die stack and forming an upper molded surface of the die stack;
   first conductive traces that are operably coupled to an active surface of the first die, the first conductive traces extending from between the first die and the second die to corresponding first via locations in the molding material beyond a first side edge of the die stack;
   second conductive traces that are operably coupled to an active surface of the second die opposite the first die, the second conductive traces extending to corresponding second via locations in the molding material beyond the first side edge of the die stack, wherein each of the first via locations is in vertical alignment with one of the second via locations; and
   first through mold vias (TMVs) extending through the molding material between vertically aligned ones of the first and second via locations, each of the first TMVs comprising conductive material having a first end surface in contact with a corresponding one of the first conductive traces and a second end surface in contact with a corresponding one of the second conductive traces at a location approximately planar with the active surface of the second die,
      wherein the molding material extending between upper surfaces of the first conductive traces and the upper molded surface of the die stack is free from any TMV.

2. The semiconductor device of claim 1, further comprising a layer of material positioned between the first and second dies, the layer of material extending at least over a top surface of the first conductive traces.

3. The semiconductor device of claim 2, wherein the layer of material comprises die attach film or film over wire.

4. The semiconductor device of claim 1, wherein the first and second conductive traces comprise first and second fan-out redistribution layers.

5. The semiconductor device of claim 1, wherein the first TMVs extend between upper surfaces of the second conductive traces and bottom surfaces of the first conductive traces.

6. The semiconductor device of claim 1, wherein a first one of the first TMVs is located a distance D1 from the first side edge and a second one of the first TMVs is located a distance D2 from the first side edge, wherein D1 is greater than D2.

7. The semiconductor device of claim 1, further comprising:
   a third die positioned in alignment with the second die in the die stack, the second conductive traces positioned between the second die and the third die;
   third conductive traces that are operably coupled to an active surface of the third die opposite the second die, the third conductive traces extending to corresponding third via locations in the molding material beyond the first side edge of the die stack, wherein each of the third via locations is in vertical alignment with one of the second via locations;
   second TMVs extending through the molding material between vertically aligned ones of the second and third via locations, each of the second TMVs comprising conductive material having a first end surface in contact with a corresponding one of the third conductive traces and a second end surface in contact with a corresponding one of the second conductive traces.

8. The semiconductor device of claim 1, further comprising:
   a redistribution structure positioned proximate the active surface of the second die; and third conductive traces operably coupled to the active surface of the second die and the redistribution structure.

9. The semiconductor device of claim 8, wherein the redistribution structure includes a passivation layer.

10. A semiconductor device comprising:
first and second dies forming a die stack;
molding material encasing side edges of the die stack to form side regions and a back surface of the second die to form an upper molded surface;
a redistribution structure positioned proximate an active surface of the first die;
first conductive traces coupled to the active surface of the first die, the first conductive traces extending beyond a first side edge of the first die to first via locations in a first side region within the molding material;
second conductive traces coupled to an active surface of the second die, the second conductive traces extending beyond the first side edge of the first die to second via locations in the first side region within the molding material;
through mold vias (TMVs) extending proximate the first side edge of the first die in the first side region, the TMVs extending between and connecting the first conductive traces and corresponding ones of the second conductive traces at locations approximately planar with the active surface of the second die, wherein the molding material extending between the first conductive traces and the upper molded surface of the die stack is free from any TMV; and
third conductive traces coupled to the active surface of the first die and extending into the redistribution structure.

11. The semiconductor device of claim 10, wherein the third conductive traces are configured to carry signals associated with first and second dies.

12. The semiconductor device of claim 10, wherein the redistribution structure includes a passivation layer and an RDL layer.

\* \* \* \* \*